US011537925B2

(12) United States Patent
Javadiabhari et al.

(10) Patent No.: US 11,537,925 B2
(45) Date of Patent: Dec. 27, 2022

(54) SYSTEM AND METHOD FOR LATENCY-AWARE MAPPING OF QUANTUM CIRCUITS TO QUANTUM CHIPS

(71) Applicant: INTERNATIONAL BUSINESS MACHINES CORPORATION, Armonk, NY (US)

(72) Inventors: Ali Javadiabhari, Sleepy Hollow, NY (US); Scott D. Lekuch, New York, NY (US); Ken Inoue, Elmsford, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 464 days.

(21) Appl. No.: 16/446,426

(22) Filed: Jun. 19, 2019

(65) Prior Publication Data

US 2020/0401923 A1    Dec. 24, 2020

(51) Int. Cl.
*G06N 10/00* (2022.01)
*B82Y 10/00* (2011.01)
*H03M 1/66* (2006.01)

(52) U.S. Cl.
CPC .............. *G06N 10/00* (2019.01); *B82Y 10/00* (2013.01); *H03M 1/662* (2013.01)

(58) Field of Classification Search
CPC .................................................. G06N 10/00
See application file for complete search history.

(56) References Cited

U.S. PATENT DOCUMENTS

| | | | |
|---|---|---|---|
| 9,946,973 B2 | 4/2018 | Biercuk et al. | |
| 10,068,183 B1 | 9/2018 | van Rooyen | |
| 10,127,499 B1 | 11/2018 | Rigetti et al. | |
| 2009/0070402 A1 | 3/2009 | Rose et al. | |
| 2018/0260245 A1 | 9/2018 | Smith | |
| 2018/0260732 A1 | 9/2018 | Bloom et al. | |
| 2019/0042965 A1 | 2/2019 | Clarke et al. | |

OTHER PUBLICATIONS

Dousti et al "Minimizing the Latency of Quantum Circuits during Mapping to the Ion-Trap Circuit Fabric," https://arxiv.org/abs/1412.8003 Dec. 2014 (Year: 2014).*
Siu, "Direct mapping of quantum circuits to adiabatic algorithms", arXiv:quant-ph/0409024, Sep. 3, 2004.
(Continued)

*Primary Examiner* — Matthew L Reames
(74) *Attorney, Agent, or Firm* — Amin, Turocy & Watson, LLP

(57) ABSTRACT

A quantum circuit generator for a quantum computer includes a controller; and a plurality of analog conversion units (ACUs) operatively connected to the controller, each ACU being operatively connected to a corresponding qubit of a plurality of qubits, wherein each ACU is configured to convert a digital input from the controller into an analog input at a microwave frequency to control a quantum state of the corresponding qubit. The controller is configured to generate a quantum circuit using at least two qubits of the plurality of qubits, the at least two qubits being selected by the controller based on corresponding classical bits being mapped by the controller and based on latency of the generated quantum circuit so that the generated quantum circuit has a latency less than a threshold latency.

25 Claims, 5 Drawing Sheets

(56) References Cited

OTHER PUBLICATIONS

Fu X et al., "An Experimental Microarchitecture for a Superconducting Quantum Processor",2017 50th Annual IEEE/ACM International Symposium On Microarchitecture (MICRO), ACM, Oct. 14, 2017, pp. 813-825.
Yunong Shi et al., "Optimized Compilation of Aggregated Instructions for Realistic Quantum Computers", arxiv.org <http://arxiv.org>, Cornell University Library, 201 Olin Library Cornell University Ithaca, NY 14853, Feb. 4, 2019.
Yves Salathe et al., "Low-Latency Digital Signal Processing for Feedback and Feedforward in Quantum Computing and Communication", arxiv.org <http://arxiv.org>, Cornell University Library, 201 Olin Library Cornell University Ithaca, NY 14853,Sep. 4, 2017.
PCT/EP2020/065973 International Search Report dated Aug. 20, 2020.
PCT/EP2020/065973 Written Opinion dated Aug. 20, 2020.

\* cited by examiner

SYSTEM AND METHOD FOR LATENCY-AWARE MAPPING OF QUANTUM CIRCUITS TO QUANTUM CHIPS

BACKGROUND

The currently claimed embodiments of the present invention relate to quantum computation, and more specifically, to methods and devices for generating quantum circuits.

Quantum programming is the process of assembling sequences of instructions or quantum programs that are capable of running on a quantum computer in a form of a quantum circuit or quantum circuits. When a conventional quantum program is executed, a result is produced by the quantum computer. The quantum program can be relatively large and can have many quantum circuits that work independently. As a result, the time it takes to execute or run the conventional quantum program in the quantum computer and produce or obtain the result from the computer can be relatively high.

Information stored in a qubit remains coherent for a very small window of time, which is the time in which the quantum computation can be performed. A main latency bottleneck in many quantum circuits (quantum programs) depends on communication between quantum and classical logic, which can consume much of the coherence budget. This latency is due in part to i) the qubit readout from quantum to classical, and ii) classical logic followed by a decision of a next microwave pulse. In superconducting qubits, the latency due to qubit readout from quantum to classical can be about 100 nanoseconds. The latency due to classical logic followed by a decision of a next microwave pulse is highly dependent on the physical layout and system interconnectivity of analog conversion units (ACUs) which generate and receive these signals to and from the qubits. These analog conversion units (ACUs) may include digital to analog converters (DACs) and analog to digital converters (ADCs) for processing the signals to and from the qubits in the quantum device, and the spatial relation and connectivity between classical and quantum registers contribute to differing latencies in the system.

If a conditional gate is on a qubit whose readout is on the same analog conversion unit (ACU), this latency can be about 100 nanoseconds. However, if on the other hand the quantum circuit (quantum program) requires communication between different analog conversion units (ACUs), this latency can be as high as about 500 nanoseconds or even about 1 microsecond. This time frame is outside of any of today's qubit coherence times which would render quantum computation inoperable.

As a result, there is need for a solution to reduce the latency or minimize the latency in order to enable efficient quantum computation.

SUMMARY

An aspect of the present invention is to provide a quantum circuit generator for a quantum computer. The quantum circuit generator includes a controller; a plurality of analog conversion units (ACUs) operatively connected to the controller, each ACU being operatively connected to a corresponding qubit of a plurality of qubits. Each ACU is configured to convert a digital input from the controller into an analog input at a microwave frequency to control a quantum state of the corresponding qubit. The controller is configured to generate a quantum circuit using at least two qubits of the plurality of qubits, the at least two qubits being selected by the controller based on corresponding classical bits being mapped by the controller and based on latency of the generated quantum circuit so that the generated quantum circuit has a latency less than a threshold latency.

Another aspect of the present invention is to provide a quantum computer. The quantum computer includes a refrigeration container defining a refrigeration chamber therein; a quantum processor disposed inside the refrigeration chamber, the quantum processor comprising a plurality of qubits, at least two qubits in the plurality of qubits being selectable to generate a quantum circuit, the quantum circuit having a latency. The quantum processor is configurable to construct a quantum circuit using a quantum circuit generator in communication with the plurality of qubits. The quantum circuit generator includes a controller; a plurality of analog conversion units (ACUs) operatively connected to the controller, each ACU being operatively connected to a corresponding qubit of the plurality of qubits. Each ACU is configured to convert a digital input from the controller into an analog input at a microwave frequency to control a quantum state of the corresponding qubit. The controller is configured to generate the quantum circuit using at least two qubits of the plurality of qubits, the at least two qubits being selected by the controller based on corresponding classical bits being mapped by the controller and based on latency of the generated quantum circuit so that the generated quantum circuit has a latency less than a threshold latency.

Another aspect of the present invention is to provide a method for reducing a latency of a quantum circuit. The method includes mapping at least two qubits in a plurality of qubits to classical bits; generating a quantum circuit using the at least two qubits of the plurality of qubits, the at least two qubits being selected by a controller based on corresponding classical bits being mapped by the controller; determining a latency of the generated quantum circuit; and selecting the at least two qubits in the plurality of qubits so that the generated quantum circuit has a latency less than a threshold latency.

A further aspect of the present invention is to provide a computer readable medium on which is stored non-transitory computer-executable code, which when executed by a controller causes the controller to: map at least two qubits in a plurality of qubits to classical bits; generate a quantum circuit using the at least two qubits of the plurality of qubits, the at least two qubits being selected by the controller based on corresponding classical bits being mapped by the controller; determine a latency of the generated quantum circuit; and select the at least two qubits in the plurality of qubits so that the generated quantum circuit has a latency less than a threshold latency.

BRIEF DESCRIPTION OF THE DRAWINGS

The present disclosure, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

DETAILED DESCRIPTION

Figure 1:
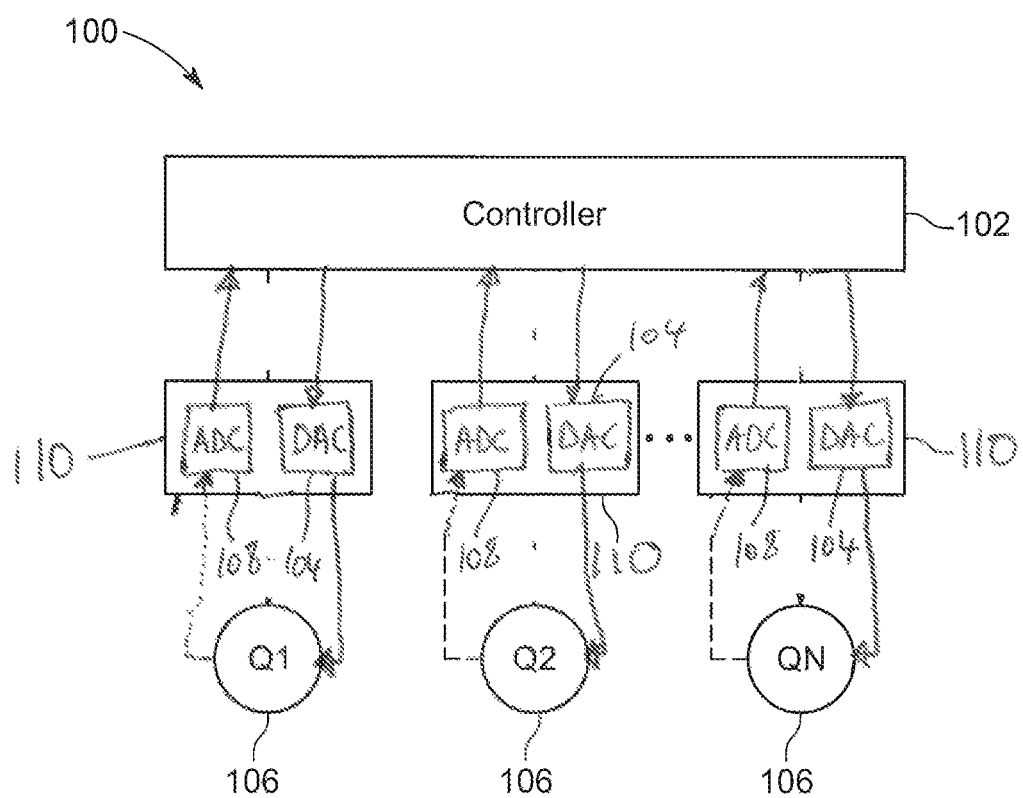
FIG. 1 is a schematic diagram of a quantum circuit generator for a quantum computer, according to an embodiment of the present invention.

FIG. 1 is a schematic diagram of a quantum circuit generator 100 for a quantum computer, according to an embodiment of the present invention. As shown in FIG. 1, the quantum circuit generator 100 for the quantum computer includes a controller 102 and a plurality analog conversion units (ACUs) 110 which may include one or more digital to analog converters (DACs) 104 and analog to digital converters (ADCs) 108. The general concepts of the current invention are not limited to any particular number of DACs 104 or ADCs 108 or total number of ACUs 110. The plurality of ACUs 110 are operatively connected to the controller 102. In an embodiment, the plurality ACUs 110 are physically connected to the controller 102 using wires or cables. In another embodiment, the plurality of ACUs 110 are wirelessly connected to the controller 102. The controller 102 can be for example a classical computer. The term "classical computer" should be understood broadly to include any computer based on binary bits including, but not limited to, a desktop computer, a laptop computer, a tablet, a mobile device, etc. Each DAC 104 and ADC 108 within an ACU 110 is operatively connected to a corresponding qubit (Q1, Q2, . . . , QN) of a plurality of qubits 106. A number of qubits 106 can be two, three or more qubits. The general concepts of the current invention are not limited to any particular number of qubits 106. Each DAC 104 is configured to convert a digital input from the controller 102 into an analog input at a microwave frequency to control a quantum state of the corresponding qubit (Q1, Q2, . . . , QN).

The controller 102 is configured to generate a quantum circuit (i.e., a quantum program) using at least two qubits (for example, Q1 and Q2) of the plurality of qubits 106. The at least two qubits (e.g., Q1 and Q2) are selected by the controller 102 based on corresponding classical bits being mapped by the controller 102 and based on latency of the generated quantum circuit so that the generated quantum circuit has a latency less than a threshold latency. The term "classical bit" is intended to refer to a binary bit that takes on only one of two values, for example 0 or 1. For example, the controller 102 can generate a quantum circuit using two, three or more qubits in a plurality of qubits, for example 4 qubits. However, the general concepts of the current invention are not limited to any particular number of qubits out of the total qubits 106 that the controller 102 uses to form the quantum circuit. Therefore, the controller 102 is configured to generate a quantum circuit using M number of qubits (wherein M is greater than or equal to two) from a plurality N number of qubits (wherein N is greater than or equal to 2). The number M of used or selected qubits is less than or equal to the number N of total available qubits.

In an embodiment, the latency of the quantum circuit includes a latency of qubit readout (shown with dotted lines in FIG. 1) of each of the at least two qubits (for example, Q1 and Q2)) from quantum to classical. In an embodiment, the latency of the quantum circuit comprises a latency due to classical logic processing in the controller 102 and a latency due to a relative position of the ACUs 110.

Figure 2:
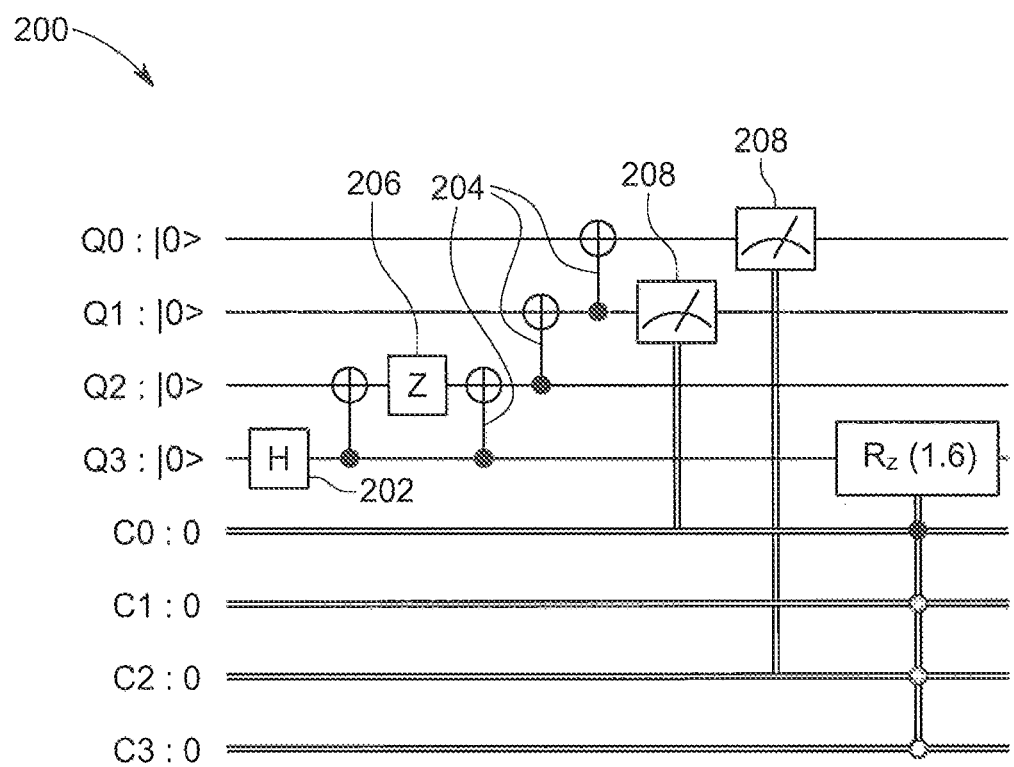
FIG. 2 is a schematic diagram of an example quantum circuit that can be generated by a controller in the quantum circuit generator, according to an embodiment of the present invention.

FIG. 2 is a schematic diagram of an example quantum circuit 200 that can be generated by the controller 102, according to an embodiment of the present invention. In this example, the quantum circuit 200 uses four qubits (Q0, Q1, Q2, Q3). Each qubit (Q0, Q1, Q2, Q3) starts at the ground state |0> and various operations are applied on the state of one or more of the qubits (Q0, Q1, Q2, Q3) using various gates such as a Hadamard gate 202, a CNOT gate 204, and a Z-gate 206, etc. Measurements 208 are performed on the one or more qubits (Q0, Q1, Q2, Q3) to determine the state of the one or more qubits (Q0, Q1, Q2, Q3) at the end of the various operations implemented using the various gates. For example, in the quantum circuit 200, a state of qubit Q0 is measured and a state of qubit Q1 is also measured. The result of the measurement 208 is converted into a classical bit (C0, C1, C2 and C3). For example, in the quantum circuit 200, the measurement 208 of the state of qubit Q0 is converted to classical bit C2 and the measurement of the state of qubit Q1 is converted to classical bit C0.

In the quantum circuit 200, the quantum circuit generator 100, recognizes that classical bits C1 and C3 are not written to. As a result, classical bits C1 and C3 which are initially zero remain zero. As the only written to classical bits are C0 and C2, the quantum circuit generator only needs to map classical bits C0 and C2. In order to reduce latency to a desired threshold latency, the controller 102 of the quantum circuit generator 100 can position the two classical bits C0 and C2 as close as possible to the ACU 110 near qubit Q3 because qubit Q3 is the qubit that will be conditionally controlled. In this way, in this case, the qubits (e.g., Q0 and Q1) which measurements are written to C0 and C2, respectively, are selected by the controller 102 based on corresponding classical bits C0 and C2 being mapped by the controller 102 and based on latency of the generated quantum circuit 200 so that the generated quantum circuit 200 has a latency less than a threshold latency.

In an embodiment, the threshold latency can be a latency selected by a user. In another embodiment, the latency threshold corresponds to a lowest latency obtained by selecting at least two qubits (for example, Q1 and Q2) that are closest to each other so as to reduce a relative position of analog conversion units (ACUs) 110 associated with the at least two qubits (for example, Q1 and Q2). In some embodiments, the threshold latency will be less than or equal to the coherence time of the quantum circuit generated.

Therefore, in some embodiments, the quantum circuit generator 100, given knowledge of layouts of the ACUs 110 (including the DACs 104 and the ADCs 108), positions the ACUs associated with the used qubits (selected qubits Q1 and Q2, for example) as close as possible so as to reduce latency.

Figure 3:
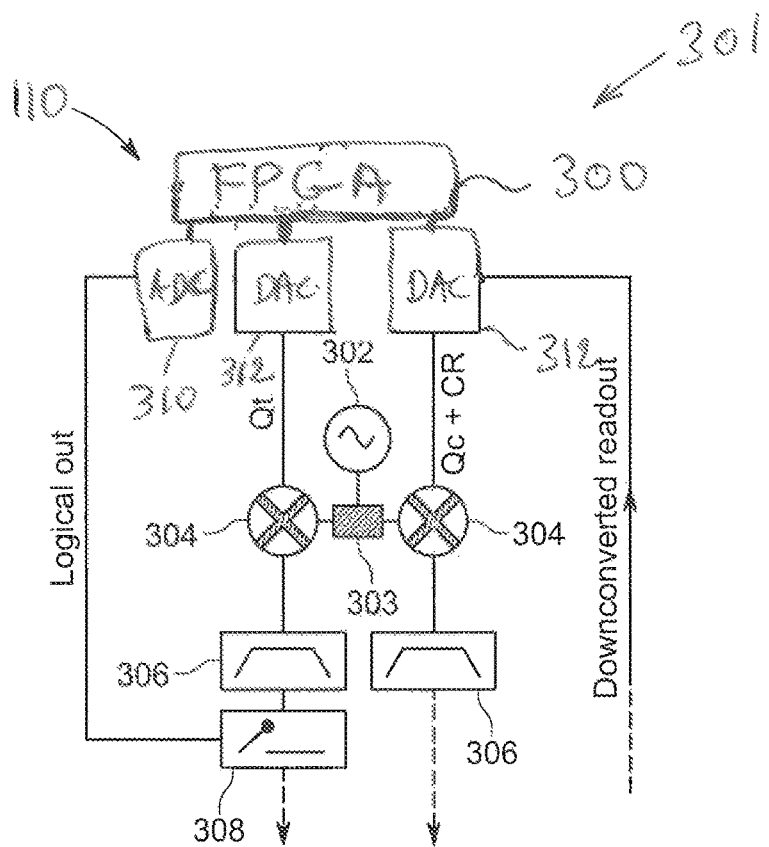
FIG. 3 is a detailed circuit diagram of an analog conversion unit (ACU) which includes a digital to analog converter (DAC) and an analog to digital converter (ADC) along with a Field Programmable Gate Array (FPGA) in the quantum circuit generator, according to an embodiment of the present invention.
Figure 4:
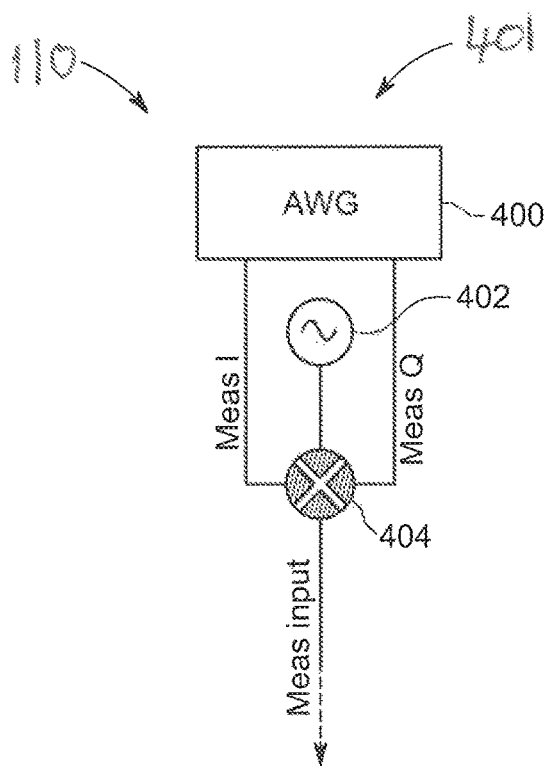
FIG. 4 is a detailed circuit diagram of the ACU which includes an industry standard Arbitrary Waveform Generator (AWG) in the quantum circuit generator, according to another embodiment of the present invention.

FIG. 3 is a detailed circuit diagram 301 of ACU 110 in quantum circuit generator 100, according to an embodiment of the present invention. FIG. 4 is a detailed circuit diagram 401 of ACU 110 in quantum circuit generator 100, according to another embodiment of the present invention. In an embodiment, as shown in FIG. 3, the ACU 301 includes a field programmable gate array (FPGA) 300 as well as a DAC 312 and an ADC 310. An FPGA is a device or integrated circuit designed to be configured by a designer after manufacturing. An FPGA contains an array of programmable logic blocks that are configurable by wiring specific blocks together. In another embodiment, as shown in FIG. 4, the ACU 401 includes an arbitrary waveform generator (AWG) 400. An AWG is a device that generates a waveform as specified by a user. In yet another embodiment, the ACU 110 is an application specific integrated circuit (ASIC). As shown in FIGS. 3 and 4, the ACUs 301, 401 each includes a corresponding local oscillator (LO) 302, 402 configured to generate a lower frequency wave radiation and a mixer or mixers 304, 404 configured to convert the lower frequency wave radiation from the LO 302, 402 into a higher frequency microwave radiation. In an embodiment, as shown in FIG. 3, the low frequency wave radiation from the LO 302 is input through splitter 303 to mixers 304 to generate the higher frequency microwave radiation. The higher frequency microwave radiation is generated to control the quantum state of the corresponding qubit (Q1, Q2 . . . QN).

In an embodiment, as shown in FIG. 3, the ACU 301 further includes at least one bandpass filter 306 configured to filter a frequency of the higher frequency microwave radiation. For example, as shown in FIG. 3, the ACUs 301 includes two bandpass filters 306. An output of one bandpass filter 306 is transmitted directly to the qubit while an output of the other bandpass filter is switched using switch 308. The switch 308 is gated by a logical out signal from the FPGA 300 to increase the transmission speed of the microwave radiation to the qubit (Q1, Q2, . . . , QN) and hence decrease the latency. The switch 308 is controlled and timed by the FPGA 300 so as to increase throughput of the microwave radiation signal input into the various qubits (Q1, Q2, . . . , QN). Therefore, as it can be understood, when inputting control signals to a qubit (illustrated by the two arrows in FIG. 3) the frequency is up-converted to a higher microwave frequency radiation. However, when reading the state of the qubit, i.e., performing the quantum measurement, the higher frequency of the microwave radiation output by the qubit is converted back to a lower frequency radiation and input back to the FPGA 300. The FPGA 300 then converts the lower frequency radiation signal into a classical bit (i.e., 0 and/or 1). The process of inputting microwave radiation into the qubit and reading the output of the quantum measurement from qubits is performed repeatedly a plurality of times.

Figure 5:
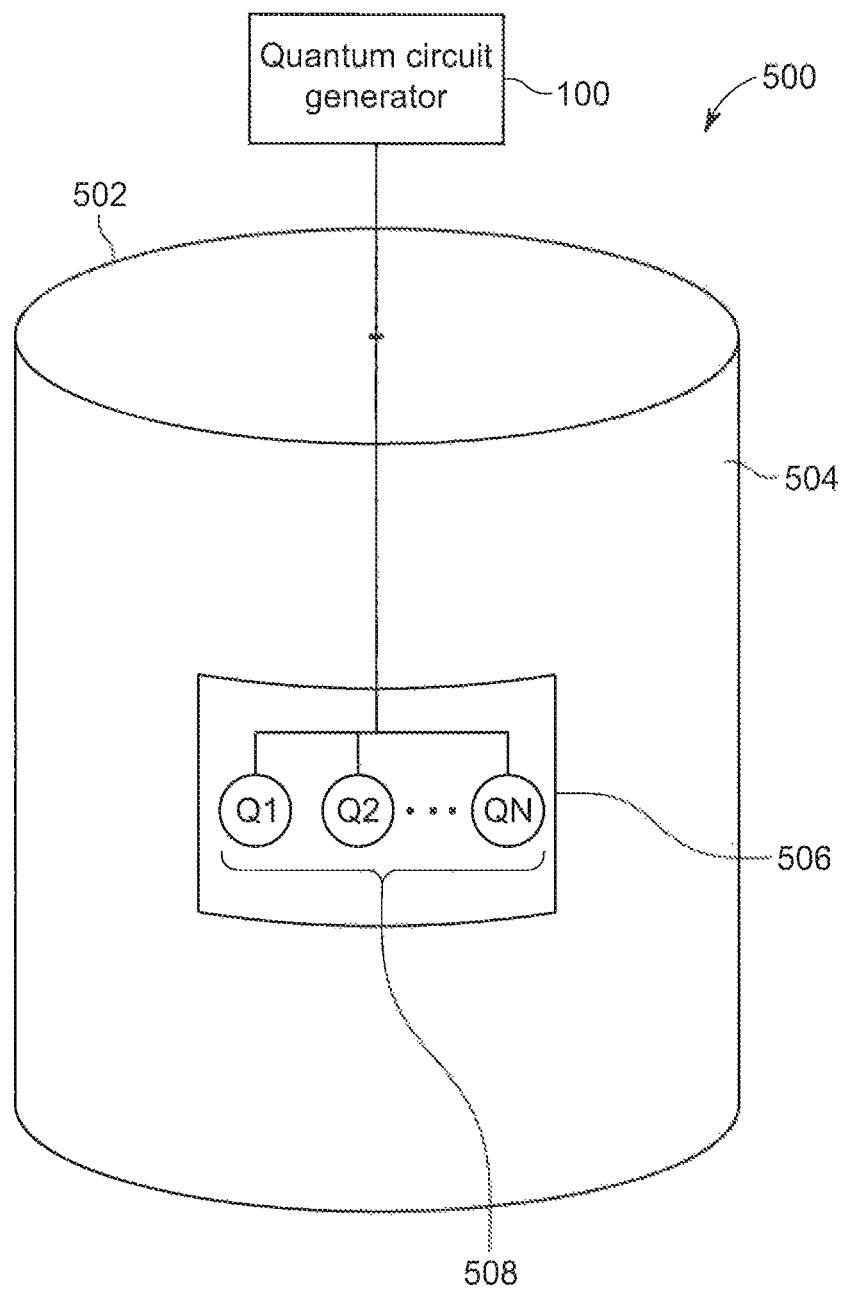
FIG. 5 is a schematic diagram of a quantum computer, according to an embodiment of the present invention.

FIG. 5 is a schematic diagram of a quantum computer 500, according to an embodiment of the present invention. The quantum computer 500 includes a refrigeration container 502 having a refrigeration chamber 504. The quantum computer 500 further includes a quantum processor 506 disposed inside the refrigeration chamber 504. The quantum processor comprising a plurality of qubits 508 (Q1, Q2, . . . , QN). At least two qubits (for example, Q1 and Q2) in the plurality of qubits 508 are selectable to generate a quantum circuit (for example, but not limited to, the quantum circuit 200), the quantum circuit having a latency. The quantum processor 506 is configurable to construct a quantum circuit (for example, but not limited to, quantum circuit 200) using the quantum circuit generator 100 in communication with the plurality of qubits 508. The specifics of the quantum circuit generator 100 are described in detail in the above paragraphs and therefore would not be repeated in the following paragraphs. As stated in the above paragraphs, the controller 102 of the quantum circuit generator 100 is configured to generate the quantum circuit (for example, but not limited to, quantum circuit 200) using at least two qubits of the plurality of qubits, the at least two qubits being selected by the controller 102 based on corresponding classical bits being mapped by the controller 102 and based on latency of the generated quantum circuit (e.g., but not limited to, quantum circuit 200) so that the generated quantum circuit (e.g., but not limited to, quantum circuit 200) has a latency less than a threshold latency.

Figure 6:
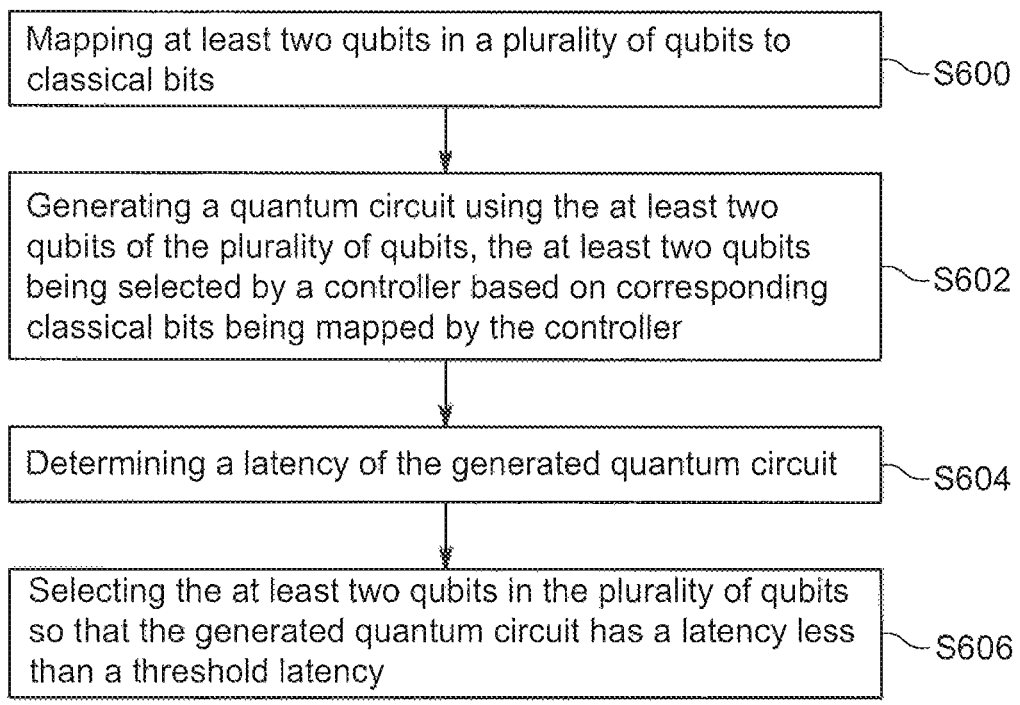
FIG. 6 is a flow chart of a method for reducing a latency of a quantum circuit, according to an embodiment of the present invention.

FIG. 6 is flow chart of a method for reducing a latency of a quantum circuit, according to an embodiment of the present invention. The method includes mapping at least two qubits (for example, Q1 and Q2) out of a plurality of qubits (Q1, Q2, . . . QN) to classical bits (C1, C2, . . . , CN), at S600. The method also includes generating a quantum circuit (for example, but not limited to, quantum circuit 200) using the at least two qubits (for example, Q1 and Q2) of the plurality of qubits (Q1, Q2, . . . , QN), the at least two qubits being selected by a controller 102 based on corresponding classical bits (for example, C1, C2) being mapped by the controller 102, at S602. The method includes determining a latency of the generated quantum circuit (for example, quantum circuit 200), at S604. The method further includes selecting the at least two qubits in the plurality of qubits so that the generated quantum circuit (e.g., quantum circuit 200) has a latency less than a threshold latency.

In an embodiment, the method can also include converting a digital input from the controller 102 using a plurality of digital to analog converters (DAC) 104 each DAC 104 being operatively connected to a corresponding qubit (Q1, Q2, . . . ) of the plurality of the qubits 106 (Q1, Q2, . . . , QN) into an analog input at a microwave frequency to control quantum states of corresponding qubits.

In an embodiment, the method can further include selecting at least two qubits that are closest to each other so as to reduce a relative position of analog conversion units 110 associated with the at least two qubits (for example, Q1 and Q2). In an embodiment, the latency of the quantum circuit comprises a latency of qubit readout of each of the at least two qubits from quantum to classical. In an embodiment, the latency of the quantum circuit comprises a latency due to classical logic processing in the controller 102 and a latency due to a relative position of the analog conversion units (ACUs) 110.

Another embodiment of the current invention provides a computer readable medium on which is stored non-transitory computer-executable code, which when executed by the controller 102 causes the controller 102 to: (a) map at least two qubits in a plurality of qubits to classical bits; (b) generate a quantum circuit using the at least two qubits of the plurality of qubits, the at least two qubits being selected by the controller based on corresponding classical bits being mapped by the controller; (c) determine a latency of the generated quantum circuit; and (d) select the at least two qubits in the plurality of qubits so that the generated quantum circuit has a latency less than a threshold latency. In an embodiment, the computer readable medium can be a memory, a memory stick, a hard disk (HHD), a solid state drive (SSD), or any other storage medium such as a network attached storage (NAS) or storage area network (SAN), etc. In another embodiment, the computer-executable code can be downloaded from a remote storage area or from the internet (e.g., cloud). In an embodiment, the controller 102 is a classical computer such as, for example, but not limited to, a desk top computer, a laptop computer, a tablet, a handheld computing device, or the like.

In an embodiment, the computer-executable code when executed by the controller 102 causes the controller 102 to control a plurality of analog conversion units (ACUs) 110, each ACU 110 being operatively connected to a corresponding qubit of the plurality of qubits (Q1, Q2, . . . , QN), to output a microwave radiation to control quantum states of corresponding qubits. In an embodiment, the computer-executable code when executed by the controller 102 causes the controller 102 to select at least two qubits (for example, Q1 and Q2) that are closest to each other so as to reduce a relative position of ACUs 110 associated with the at least two qubits (for example, Q1 and Q2).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A quantum circuit generator for a quantum computer, comprising:
a controller;
a plurality of analog conversion units (ACUs) operatively connected to the controller, each ACU being operatively connected to a corresponding qubit of a plurality of qubits, wherein each ACU is configured to convert a digital input from the controller into an analog input at a microwave frequency to control a quantum state of the corresponding qubit of the plurality of qubits;
wherein the controller generates a quantum circuit by selecting at least two qubits of the plurality of qubits to be controlled by inputs from the controller that are mapped to corresponding classical bits so that the quantum circuit has a latency less than or equal to a threshold latency that is less than or equal to a coherence time of the quantum circuit.

2. The quantum circuit generator according to claim 1, wherein the latency of the quantum circuit is based on a first latency of qubit readout from quantum data to classical data of each of the at least two qubits.

3. The quantum circuit generator according to claim 2, wherein the latency of the quantum circuit is further based on a second latency due to a communication dependency with classical logic processing in the controller and a third latency due to relative positions of the analog conversion units.

4. The quantum circuit generator according to claim 1, wherein the threshold latency corresponds to a lowest latency obtained by selecting at least two qubits that are closest to each other so as to reduce a relative position of analog conversion units associated with the at least two qubits.

5. The quantum circuit generator according to claim 1, wherein each analog conversion unit (ACU) comprises a field programmable gate array (FPGA), an arbitrary waveform generator (A WG), or an application specific integrated circuit (ASIC).

6. The quantum circuit generator according to claim 5, wherein each ACU further comprises a local oscillator (LO) configured to generate a lower frequency wave radiation and a mixer configured to convert the lower frequency wave radiation into a higher frequency microwave radiation.

7. The quantum circuit generator according to claim 6, wherein the higher frequency microwave radiation is generated to control the quantum state of the corresponding qubit.

8. The quantum circuit generator according to claim 6, wherein each ACU further comprises at least one bandpass filter configured to filter a frequency of the higher frequency microwave radiation.

9. A quantum computer, comprising:
a refrigeration container defining a refrigeration chamber therein;
a quantum processor disposed inside the refrigeration chamber, the quantum processor comprising a plurality of qubits, at least two qubits in the plurality of qubits being selectable to generate a quantum circuit, the quantum circuit having a latency;
wherein the quantum processor is configurable to construct the quantum circuit using a quantum circuit generator in communication with the plurality of qubits, the quantum circuit generator comprising:
a controller;
a plurality of analog conversion units (ACUs) operatively connected to the controller, each ACU being operatively connected to a corresponding qubit of the plurality of qubits, wherein each ACU is configured to convert a digital input from the controller into an analog input at a microwave frequency to control a quantum state of the corresponding qubit of the plurality of qubits;
wherein the controller generates the quantum circuit by selecting the at least two qubits of the plurality of qubits to be controlled by inputs from the controller that are mapped to corresponding classical bits so that the latency of the quantum circuit is less than or equal to a threshold latency that is less than or equal to a coherence time of the quantum circuit.

10. The quantum computer according to claim 9, wherein the controller is a classical computer executing classical logic processing.

11. The quantum computer according to claim 10, wherein the latency of the quantum circuit is based on a first latency of qubit readout from quantum data to classical data of each of the at least two qubits.

12. The quantum computer according to claim 11, wherein the latency of the quantum circuit is further based on a second latency due to a communication dependency with classical logic processing in the controller and third latency due to relative positions of the ACUs.

13. The quantum computer according to claim 9, wherein the threshold latency corresponds to a lowest latency obtained by selecting at least two qubits that are closest to each other so as to reduce a relative position of digital to analog converters associated with the at least two qubits.

14. The quantum computer according to claim 9, wherein each ACU comprises a field programmable gate array (FPGA), an arbitrary waveform generator (A WG), or an application specific integrated circuit (ASIC).

15. The quantum computer according to claim 14, wherein each ACU further comprises a local oscillator (LO) configured to generate a lower frequency wave radiation and a mixer configured to convert the lower frequency wave radiation into a higher frequency microwave radiation.

16. The quantum computer according to claim 15, wherein the higher frequency microwave radiation is generated to control the quantum state of the corresponding qubit.

17. The quantum computer according to claim 15, wherein each ACU further comprises at least one bandpass filter configured to filter a frequency of the higher frequency microwave radiation.

18. A method for reducing a latency of a quantum circuit, comprising:
mapping at least two qubits in a plurality of qubits to classical bits; and
generating the quantum circuit by selecting the at least two qubits of the plurality of qubits to be controlled by inputs from a controller mapped to corresponding classical bits so that the latency of the quantum circuit is less than or equal to a threshold latency that is less than or equal to a coherence time of the quantum circuit generated.

19. The method according to claim 18, further comprising converting a digital input from the controller by a plurality of analog conversion units (ACUs), each ACU being operatively connected to a corresponding qubit of the plurality of qubits into an analog input at a microwave frequency to control quantum states of corresponding qubits.

20. The method according to claim 19, further comprising selecting the at least two qubits that are closest to each other so as to reduce a relative position of analog conversion units (ACUs) associated with the at least two qubits.

21. He method according to claim 19, wherein the latency of the quantum circuit is based on a first latency of qubit readout from quantum to classical of each of the at least two qubits.

22. The method according to claim 21, wherein the latency of the quantum circuit is further based on a second latency due to a communication dependency with classical logic processing in the controller and a third latency due to relative positions of the analog conversion units (ACUs).

23. A computer readable medium on which is stored non-transitory computer-executable code, which when executed by a controller causes the controller to:
map at least two qubits in a plurality of qubits to classical bits; and
generate a quantum circuit by selecting the at least two qubits of the plurality of qubits to be controlled by inputs from the controller mapped to corresponding classical bits; determine a latency of the generated quantum circuit; and
select the at least two qubits in the plurality of qubits so that the latency of the quantum circuit is less than or equal to a threshold latency that is less than or equal to a coherence time of the quantum circuit generated.

24. The computer readable medium according to claim 23, wherein the computer-executable code when executed by the controller causes the controller to control a plurality of analog conversion units (ACUs), each ACU being operatively connected to a corresponding qubit of the plurality of qubits, to output a microwave radiation to control quantum states of corresponding qubits.

25. The computer readable medium according to claim 24, wherein the computer-executable code when executed by the controller causes the controller to select the at least two qubits that are closest to each other so as to reduce a relative position of analog conversion units (ACUs) associated with the at least two qubits.

* * * * *